United States Patent [19]

Fouquet et al.

[11] Patent Number: 5,434,874
[45] Date of Patent: Jul. 18, 1995

[54] METHOD AND APPARATUS FOR OPTIMIZING OUTPUT CHARACTERISTICS OF A TUNABLE EXTERNAL CAVITY LASER

[75] Inventors: Julie E. Fouquet, San Carlos; David M. Braun, Santa Rosa, both of Calif.

[73] Assignee: Hewlett-Packard Company, Palo Alto, Calif.

[21] Appl. No.: 134,424

[22] Filed: Oct. 8, 1993

[51] Int. Cl.⁶ .............................................. H01S 3/10
[52] U.S. Cl. .................................... 372/20; 372/99; 372/97
[58] Field of Search ................... 372/20, 96, 92, 99, 372/97

[56] References Cited

U.S. PATENT DOCUMENTS

| | | | |
|---|---|---|---|
| 4,858,240 | 8/1989 | Pohler et al. | 372/10 |
| 4,873,692 | 10/1989 | Johnson et al. | 372/20 |
| 5,050,179 | 9/1991 | Mooradian | 372/44 |
| 5,097,476 | 3/1992 | Thiessen | 372/92 |
| 5,115,444 | 5/1992 | Kirkby et al. | 372/102 |
| 5,140,599 | 8/1992 | Thruna et al. | 372/102 |
| 5,161,165 | 11/1992 | Zorabodian | 372/102 |
| 5,263,037 | 11/1993 | Trutnau et al. | 372/102 |
| 5,301,059 | 4/1994 | Kitaoka et al. | 372/22 |

FOREIGN PATENT DOCUMENTS

| | | | |
|---|---|---|---|
| 0482733 | 4/1992 | European Pat. Off. | H01S 3/19 |
| 2661785 | 11/1991 | France | H01S 3/091 |
| 56-126994 | 1/1992 | Japan | H01S 3/10 |

Primary Examiner—Léon Scott, Jr.

[57] ABSTRACT

The invention increases the tuning range of a laser by altering the output coupler reflectivity. In a first embodiment of the invention, the tuning range of an external cavity laser is increased by applying a substantially spectrally flat reflective coating to the front facet of a semiconductor laser which has higher reflectivity than the uncoated front facet. In addition to increasing the tuning range, the increased reflectivity of the front facet reduces the laser threshold current for all laser wavelengths. In a second embodiment of the invention, various complex coatings were applied to the output coupler to generate reflective characteristics that change according to wavelength. The complex coatings enhance reflectance at the edges of the laser tuning curve without adversely affecting the output power at the center wavelengths. This further increases the tuning range of the laser while simultaneously maintaining high output power for each selected output wavelength.

27 Claims, 7 Drawing Sheets

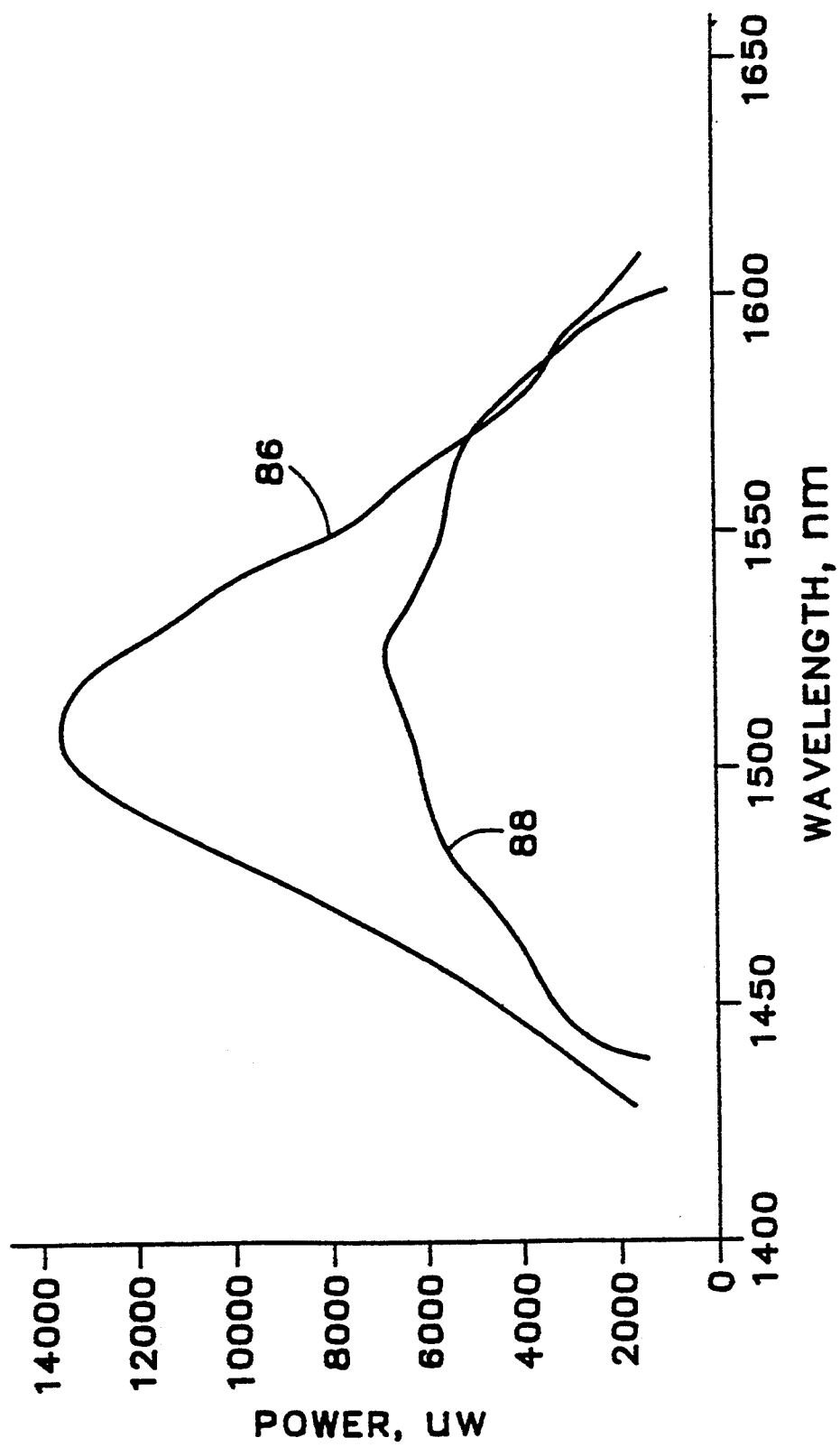

METHOD AND APPARATUS FOR OPTIMIZING OUTPUT CHARACTERISTICS OF A TUNABLE EXTERNAL CAVITY LASER

BACKGROUND OF THE INVENTION

This invention relates generally to tunable lasers and more particularly to enhancing the output characteristics of an external cavity semiconductor laser.

Lasers can be designed so that only a single, narrow wavelength of light is emitted upon activation. Many applications, however, require laser systems that generate variable discrete wavelengths (i.e., tunable lasers). Tunable lasers have been developed and used for years by scientists and engineers to study various optical phenomena. For example, in communication systems, optical fibers exhibit low loss at wavelengths near 1.3 micrometers ($\mu$m) and 1.55 $\mu$m. Research and development in this area, therefore, require general purpose lasers that can generate laser light in these wavelength ranges.

Conventional tunable lasers, however, such as the external cavity semiconductor laser, color center laser, and the tunable dye laser, do not reliably emit light throughout the entire range of wavelengths required for many present research and development applications (e.g., 1.32±0.1 $\mu$m and 1.55±0.1 $\mu$m). Tunable dye lasers are difficult to operate, are not commercially available, and the dyes are not stable over time. Color center lasers are available that can be tuned in a small wavelength range around 1.5 $\mu$m. However, the color center crystal must be kept at very low temperatures at all times to avoid losing the optical properties that allow it to produce laser radiation. Thus, color center lasers are inconvenient and are not stable over a broad range of environmental conditions. In addition, the color center crystals used in present laser systems cannot generate wavelengths near 1.3 $\mu$m. External cavity semiconductor lasers are available around both 1.3 $\mu$m and 1.55 $\mu$m, but suffer from limited tuning ranges.

In addition to limited tuning range, present tunable lasers also have limited output power. For example, each semiconductor laser has a threshold current which denotes the amount of current required for the laser to efficiently generate light (i.e., lase). Optically pumped lasers also have threshold levels. Below threshold, the light output is very inefficient, and most of the energy from the drive current is lost as heat. Light emission becomes much stronger above the current threshold. This means more of the electrical or optical input energy emerges from the laser as light energy. When the laser threshold is high, more input power is dissipated as heat, which tends to shorten laser operating life and lower the peak output power.

The threshold of a tunable laser changes according to the laser output wavelength. Typically, threshold is higher at the outer edges of the tuning range than at the center of the range. For example, a typical semiconductor laser with a high threshold current near the center of the tuning range usually exhibits a narrow tuning range because the threshold current exceeds maximum allowable operating current relatively close to the center wavelength.

The external cavity laser, as described in U.S. Pat. No. 4,839,308 to Fye, uses a gain medium such as a semiconductor (laser chip). The laser chip has both front and back facets, the back facet having an antireflection coating. Light from the laser chip passes through the back facet into an external cavity. The cavity contains a tuning element, such as a prism or grating, that reflects specific laser wavelengths back into the laser chip. This action causes the laser to output selectable wavelengths through the front facet. Thus, the wavelength of light output from the front facet of the laser chip can be controlled by changing the angle of the grating.

U.S. Pat. No. 4,942,583 to Nazarathy et al, and U.S. Pat. No. 5,140,599 to Trutna, Jr. et al, and IEEE Journal of Quantum Electronics, Vol. QE-17, No. 1, January 1981 entitled "Spectral Characteristics of External-Cavity Controlled Semiconductor Lasers" describe tunable external cavity lasers. However, none of the above disclosures address the problems associated with limited tuning range.

Accordingly, a need remains for widely tunable high output power lasers that are stable over varying environmental conditions.

SUMMARY OF THE INVENTION

It is, therefore, an object of the invention to increase the tuning range of an external cavity semiconductor laser.

A second object of the invention is to increase laser output power over a large wavelength tuning range.

Another object of the invention is to increase the operating life and portability of high bandwidth tunable lasers.

Another object of the invention is to increase controllability of laser output characteristics.

The invention increases the tuning range of a laser by increasing the output coupler reflectivity. This allows a wide range of wavelengths to be efficiently emitted from the laser. The invention also makes it possible to adaptively vary the reflectance of a laser output coupler with laser wavelength to maximize output power at each wavelength while simultaneously increasing the tuning range.

In accordance with the invention, the bandwidth of an external cavity laser is increased. Previous attempts have been made to increase the reflectivity of the laser's rear facet to increase output power. The present invention, however, takes the novel approach of increasing the reflectivity of the front (output coupler) facet to expand the range of wavelengths that can be output from the laser (tuning range). Altering the reflectivity of the front facet allows the semiconductor chip to lase in the external cavity over a broader range of wavelengths.

In a first embodiment of the invention, the reflective coating applied to the laser chip's front facet has a generally constant (flat) reflectance higher than the uncoated laser chip reflectivity across a predetermined range of wavelengths. The uniform reflectance increases laser bandwidth and reduces threshold current. A flat reflective coating, such as alternating layers of silicon and aluminum oxide, which reflects all wavelengths equally, has been demonstrated to increase the turning range by as much as 60%.

In a second embodiment of the invention, complex reflectance coatings are applied to the front facet to increase the laser wavelength tuning range while simultaneously maximizing output power. The complex coatings increase reflectance only at the edges of the wavelength tuning range. This enhancement is performed without decreasing output power for wavelengths at the center of the tuning range.

The complex coatings are produced by applying multiple layers of various materials to the front facet. Typical multi-layer coatings comprise alternating layers of silicon and either aluminum oxide or silicon dioxide. These coatings change the reflectivity of the front facet according to wavelength. They are typically designed to extend the tuning range and maintain high laser output power beyond that of the flat reflective coating. The multi-layer coatings can also be applied to the tunable mirror (e.g., prism or grating) in the external laser cavity or to a separate output mirror in a ring or linear cavity laser, as opposed to the front facet of the semiconductor chip.

Alternatively, an output coupler with a spatially varying reflectance can be moved to different positions so that the output coupler reflectance can be changed according to laser wavelength. Thus, the laser can provide maximum output power at each selected wavelength.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIG. 9 is a graph showing the output power vs. wavelength response for an external cavity laser with a bare output facet and after a complex reflective coating has been deposited on the output facet.

DETAILED DESCRIPTION

Figure 1:
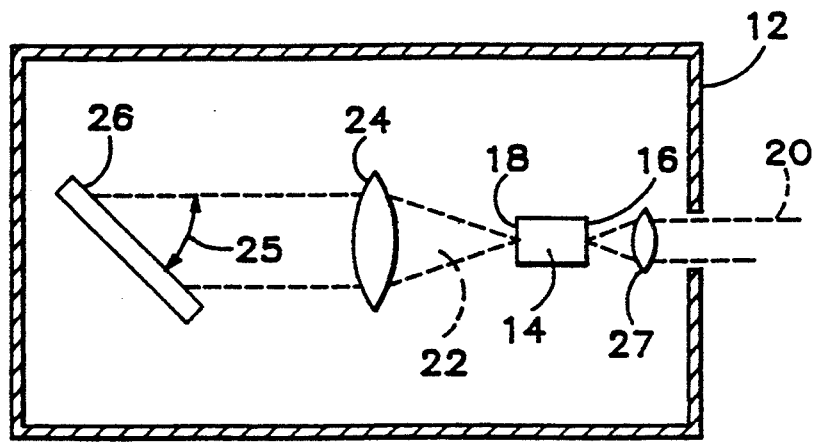
FIG. 1 is a schematic diagram showing the general configuration of an external cavity laser.

FIG. 1 is a diagram showing a tunable external cavity laser. A laser cavity contains the laser gain medium 14, lens 24, output collimating lens 27, and reflective tuning element 26. The tuning element 26 is typically a mirror, prism, or grating. The gain medium 14, in one embodiment of the invention, consists of a semiconductor laser chip with front facet 16 and back facet 18. Tunable lasers have an output coupler where light is emitted from the laser cavity, which in the system shown in FIG. 1, consists of the front facet 16 of the laser chip 14.

Figure 2A:
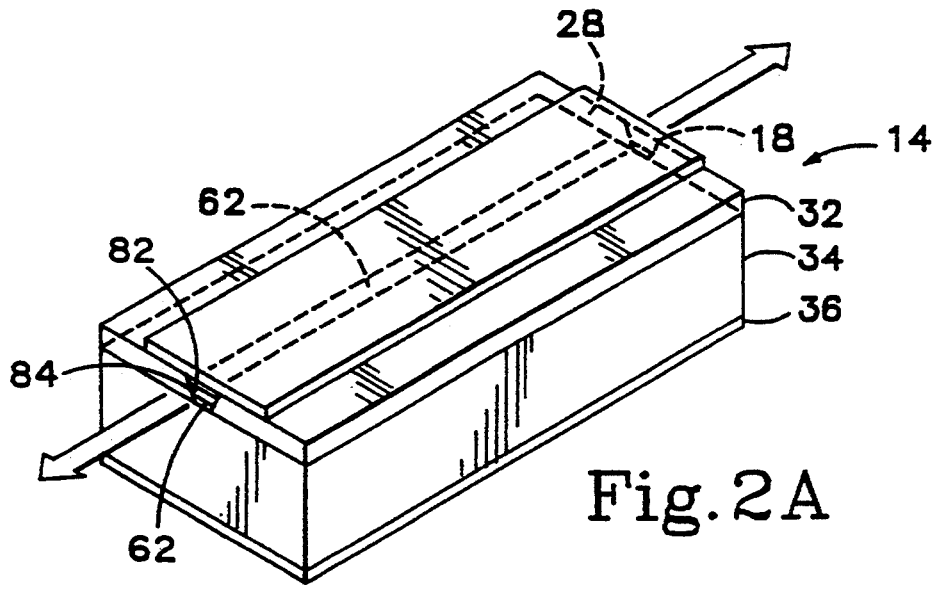
FIG. 2A is a perspective view of a prior art semiconductor laser chip used in the external cavity laser of FIG. 1.
Figure 2B:
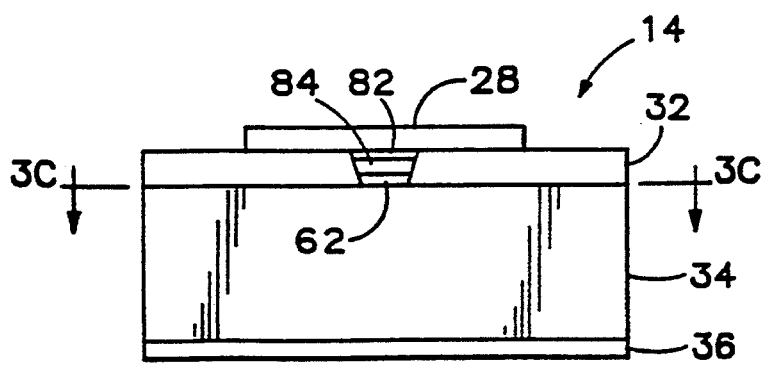
FIG. 2B is a front view of the semiconductor laser chip shown in FIG. 2A.

FIG. 2A is a detailed perspective view and FIG. 2B is a front view of the laser chip 14 previously shown in FIG. 1. A typical semiconductor laser chip comprises a first metal contact 28 coupled to a GaInAs contact layer 82 of the first dopant type. An InP upper cladding layer 84 of the first dopant type lies between the contact layer 82 and an active region 62. An indium phosphide lower cladding layer and substrate 34 of the second dopant type reside between the active region 62 and a second contact 36. The active region 62 produces light and may comprise either a bulk layer or quantum well structure. Semi-insulating or thyristor-doped InP 32 blocks current conduction around the active region, so that all the drive current must flow through the active region for the greatest light production.

The front and rear facets, 16 and 18, respectively, are created by cleaving the front and rear ends of the active region 62. The front output facet 16 contains a multi-layer reflective coating 40 (see FIG. 2C). The semiconductor laser is preferably a semi-insulating planar buried heterostructure(SIPBH) laser and is described in co-pending application Ser. No. 07/896,276 filed on Jul. 31, 1992, operated as a laser. However, many other types of laser structures and semiconductor laser materials (e.g. AlGaAs or AlGaInP) can be used.

When a current is applied to the laser chip 14, light is generated by recombination of electron-hole pairs in the active region 62. This light creates spontaneous emission in various directions within the chip. If light is to experience amplification, it must travel in the plane of the active region 62 along a waveguide. The feedback that concentrates stimulated emission in the active region is created by the reflection of light at either end of the semiconductor crystal by the facets 16 and 18. Semiconductors have a high refractive index so, even without a reflective coating, the facets 16 and 18 reflect about 30% of light back into the semiconductor material. This 30% reflectivity provides enough feedback for laser action in the stand-alone semiconductor laser chip.

At low current levels, a laser chip generates spontaneous emission by the same processes that drive LEDs. As the current level increases, however, diode lasers pass a threshold where stimulated emission (laser action) begins. Once the current has passed the threshold level, the light intensity rises steeply as a result of stimulated emission.

Below threshold, the light output is very inefficient, and most energy from the drive current is lost as heat. Above threshold, light emission becomes more efficient. Thus, the threshold current is an important parameter in the operation of semiconductor lasers.

Referring back to FIG. 1, the lens 24 directs light 22, emitted from the rear facet 18 of chip 14, onto grating 26. The grating 26 then diffracts the light so that only one wavelength returns at the proper angle back to the laser chip 14. Thus, light oscillates back and forth between the output facet 16 of the laser chip 14 and the grating 26. The net gain in the laser cavity is highest for the wavelength diffracted by the grating 26 back to the laser chip facet. The shorter and longer wavelengths reaching grating 26 diffract to the sides of the cavity and are lost. Thus, the oscillation wavelength of output beam 20 can be tuned across a variable range by adjusting the angle 25 of the grating 26.

To allow light to oscillate between the laser chip front facet 16 and the grating 26, an anti-reflective (AR) coating is applied to the laser back facet 18. Conventionally, no special coating is placed on the front facet 16. As light in the laser hits the front facet, the semiconductor-to-air interface creates a natural reflectance of approximately 30%. This natural reflectance reflects enough light back into the semiconductor material for lasing to take place near the peak gain wavelength at reasonable threshold currents.

As the grating 26 is tuned away from the gain peak (i.e., the wavelength at which the laser exhibits the highest gain), the chip gain decreases and the net gain of the external cavity laser decreases. Gain is the amount of stimulated emission a photon can generate (amplification) per unit distance traveled in the laser cavity. Usually, gain increases with increasing laser drive current. If the wavelength is far enough from the peak gain, chip gain is low, there is not enough gain to make up for the losses and the laser won't lase. These wavelengths, both above and below the center of the gain curve, define the outer boundaries of the laser tuning range, for a given maximum laser drive current.

To explain further, the laser will go into oscillation, or lase, when the round trip gain (from the front output facet to the external grating) exceeds the round trip loss. This oscillation condition is described by the following oscillation threshold equation:

$$R_{oc} R_{back} \operatorname{Exp}[2(\Gamma g - \alpha) L_{chip}] = 1, \quad (1)$$

where $R_{oc}$ is the output coupler (front) mirror power reflectivity. $\Gamma$ is the optical confinement factor, "g" is the chip gain per centimeter (cm$^{-1}$), $\alpha$ is the chip loss in cm$^{-1}$ (including confinement effects), and $L_{chip}$ is the length of the semiconductor gain medium in centimeters (cm). $R_{back}$ is the power reflectivity from the reflective tuning element 26 at the wavelength of the light that is coupled back into the laser gain medium 14. All cavity losses except output coupling and chip length-dependent losses ($\alpha L_{chip}$) are lumped into $R_{back}$.

Typically, designers try to make $R_{back}$ as large as possible by minimizing cavity losses. The output coupler (e.g., the uncoated front facet 16 of the laser), typically has a reflectivity of $R_{oc} = 0.3$, which is calculated from the Fresnel reflection formulas at the semiconductor-air interface. For many external cavity tunable lasers this value of $R_{oc}$ causes the laser to operate relatively efficiently at the center wavelength, but not at the edges of the tuning curve. Actually, this value of $R_{oc}$ is generally not optimal, even at the center of the tuning curve.

The gain of the chip depends strongly on wavelength, dropping to lower values as the laser is tuned away from the optimum wavelength. Eventually the gain "g" drops below the threshold for oscillation, and the laser no longer oscillates. The minimum gain required for oscillation is defined as $$g = (1/\Gamma)(\alpha - [(\ln (R_{oc} R_{back}))/2L_{chip}])$$

A laser may only be able to tune over a narrow tuning range, from a cutoff at the shortest wavelength to another cutoff at the longest wavelength, for example, of approximately 40 nanometers (nm). It is desirable, however, to have a tuning range that is equal to or greater than 180 nm. While various measures (for example optimizing $\Gamma$, $L_{chip}$ and the stripe width of the active region 62) have been employed to increase the gain over a wider range of wavelengths, the tuning range is still unacceptably narrow. The problem has been typically approached from the rear facet 18 of the semiconductor medium, a surface within the laser cavity. For example, by increasing the reflectivity of this rear facet, the net gain of the laser can be increased at certain wavelengths. However, the gain and threshold current are both degraded at other wavelengths, leading to a threshold vs. wavelength tuning curve that oscillates strongly.

The present invention increases the tuning range by altering the reflectivity of the front facet 16 ($R_{oc}$). For example, a laser without a reflective coating deposited on the front facet with a peak wavelength of 1.55 $\mu$m may only be able to tune from 1.53 $\mu$m to 1.57 $\mu$m. If the reflectance of the front facet is increased, however, the round trip losses are reduced. This allows the laser to operate at more extreme wavelengths (i.e., wavelengths farther away from the 1.55 $\mu$m peak wavelength).

In a preferred embodiment, coatings are either designed to have a flat reflectance or designed to closely match an "ideal" coating profile. The "ideal" coating profile is generated using measurements of the gain medium in an external cavity before an output coupler coating is applied. Information from a net gain vs. current curve is then used to produce "ideal" coating reflectivity curves for different currents. A coating design is then derived consistent with the "ideal" model.

To explain further, the net gain ($\Gamma g - \alpha$) depends on wavelength and generally increases with current. Lowering $R_{oc}$ increases the threshold current required to achieve a net gain high enough for lasing, and increasing $R_{oc}$ decreases the required threshold current. Since the edge of the tuning range is reached when the threshold current becomes too high, lowering the threshold current extends the tuning range. Thus, a simple flat reflective coating that increases $R_{oc}$ extends the tuning range (for example, from curve 42 before coating to curve 44 after coating in FIG. 4, and from curve 46 before coating to curve 48 after coating in FIG. 5).

However, increasing $R_{oc}$ with a flat coating can decrease the laser output power near the center of the gain curve. This is shown with the following equations which predict output power. To first order, gain saturation is approximated as follows, $$g = g_0/(1 + P/P_{sat})$$

where P is the circulating (internal) power and $P_{sat}$ is the circulating saturation power. At steady state, the circulating power inside the laser is constant as previously stated in the oscillation threshold Eq. 1. Noting that the laser output power $P_{out}$ equals the circulating power P times the output coupler transmission as follows, $$P_{out} = (1 - R_{oc})P.$$

the following equation is obtained for medium output coupling:

$$(P_{out}/P_{sat}) = (1 - R_{oc})\left(\frac{2\Gamma g_0 L_{chip}}{\ln(1/R_{oc}R_{back}) + 2\alpha L_{chip}} - 1\right) \quad (2)$$

The following equation describes the output power as a function of semiconductor laser parameters for high gain and high output coupler transmission (low $R_{oc}$):

$$(P_{out}/P_{sat}) = \quad (3)$$

$$(1 - R_{oc})\frac{\sqrt{R_{back}}}{(\sqrt{R_{oc}} + \sqrt{R_{back}})(1 - \sqrt{R_{oc}R_{back}})}((\Gamma g - \alpha)L_{chip} + \ln\sqrt{R_{oc}R_{back}})$$

Eq. (3) contains four variables; $L_{chip}$, $R_{oc}$, $R_{back}$, and $\Gamma g - \alpha$ (which is lumped together as one variable). $L_{chip}$ is the physical chip length and is easily measured. To determine which value of $R_{oc}$ maximizes $P_{out}$ for each wavelength, the remaining unknown quantities $R_{back}$ and $\Gamma g - \alpha$ must first be determined at each wavelength. Once these values are determined, the output coupler reflectivity $R_{oc}$ which maximizes $P_{out}$ may be determined by setting the derivative of $P_{out}$ (from either Eq. (2) or Eq. (3)) with respect to $R_{oc}$ equal to zero. In practice however, $P_{out}$ has been optimized numerically using Eq. (3). Either method may be done at each wavelength to get a plot of optimum $R_{oc}$ vs. wavelength.

To determine ($\Gamma g - \alpha$) as a function of $\lambda$ and drive current (I), and $R_{back}$, the threshold of the bare chip is measured first. Then the threshold of the anti-reflection-coated chip in the external cavity laser is measured as a function of wavelength. The back reflectivity $R_{back}$ is then determined for the external cavity laser as follows. Eq. (1) can be rewritten as:

$$\frac{\Gamma g - \alpha}{I_{th}} = \frac{1}{2L_{chip}I_{th}}\ln\left(\frac{1}{R_{oc}R_{back}}\right) \quad (4)$$

The net gain per current at threshold ($\Gamma g - \alpha/I_{th}$) is intrinsic to the chip and should not depend on whether the chip stands alone or is in the cavity with the grating set at the wavelength which yields the minimum threshold. Thus $R_{back}$ is determined by assuming the net gain per current at threshold is constant and equating the right hand side of Eq. (4) evaluated for the bare chip to the right hand side of Eq. (4) evaluated for the chip in the ECL set at the wavelength which requires the lowest threshold current. Since $L_{chip}$, $I_{th}$ of the bare chip, and the minimum $I_{th}$ in the cavity have been measured, and $R_{back}$ for the bare chip and $R_{oc}$ are given by the semiconductor to air interface (0.3 here), $R_{back}$ for the external cavity laser is the only unknown and it can be analytically determined. $R_{back}$ is thus obtained, and is assumed to be constant at all wavelengths.

Now $\Gamma g - \alpha$ as a function of wavelength and drive current for the external cavity laser must be determined. It is important to remember that net gain ($\Gamma g - \alpha$) varies with current as well as with wavelength. In the most simple approximation, the net gain is assumed to be proportional to current so that at each wavelength:

$$m = \frac{\Gamma g - \alpha}{I} \quad (5)$$

where m is the proportionality constant and I is the drive current. The net gain divided by current (m) is determined for the external cavity laser at each wavelength from Eq. (4), using the $R_{back}$ just calculated and the threshold tuning curve, $I_{th}(\lambda)$. By knowing $m(\lambda)$, the net gain ($\Gamma g - \alpha$) for any laser drive current at any wavelength may be calculated from Eq. (5). Other algorithms for determining $m(\lambda)$ are also possible.

Next, $R_{back}$ and $m(\lambda)$ are used in the semiconductor output power equation (3) above. A current is selected and a net gain obtained from m. At each wavelength the output power ($P_{out}$) is optimized with respect to $R_{oc}$. A plot of optimal $R_{oc}$ vs. $\lambda$ is then generated at each assumed current (including, for example, a maximum operating current of 100 mA). A coating is then designed that, in general, matches the optimal $R_{oc}$ curves. Typically, coatings are designed to provide slightly higher reflectivity than obtained in the optimal $R_{oc}$ vs. $\lambda$ curve, since a reflectivity that is accidentally too low can seriously increase the threshold current and thus reduce the tuning range.

Figure 2C:
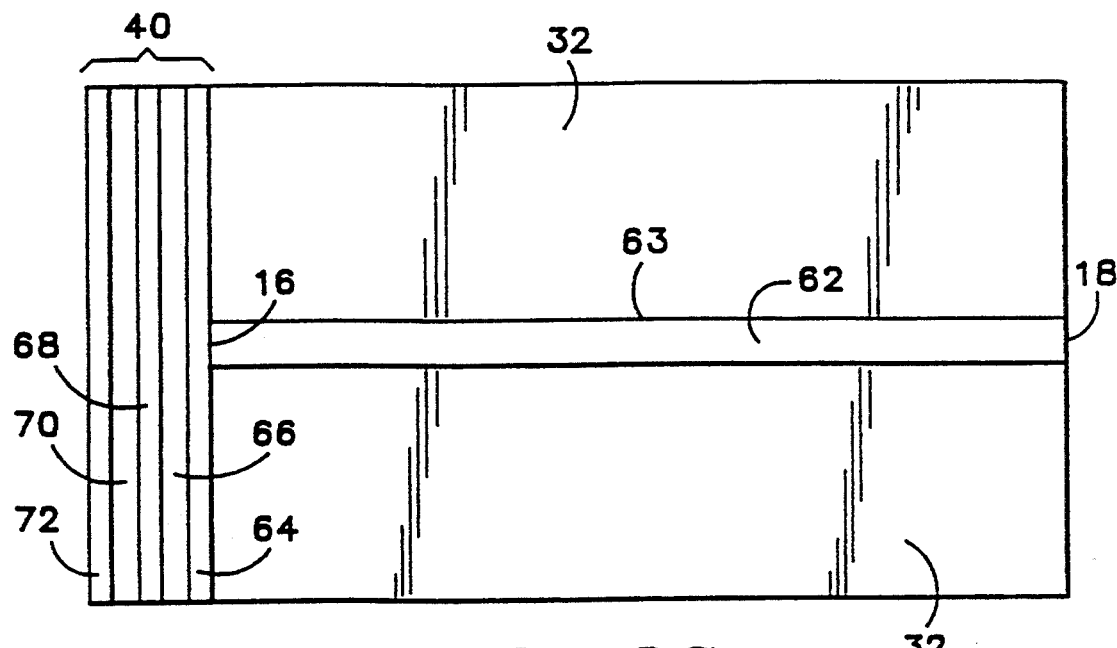
FIG. 2C is a cross-section taken along lines 3C—3C in FIG. 2B showing an output facet with a five layer reflective coating according to the invention.

FIG. 2C is a cross-sectional top view of the laser chip shown in FIG. 2 with a five layer reflective coating (not to scale). The five layer coating is used to generate the optimal $R_{oc}$ vs. $\lambda$ response derived above. The active region 62 forms the center of a laser waveguide 63. The rear facet 18 is not shown to be covered with a reflective or non-reflective coating but such a coating is generally used.

The front facet 16 is covered by a reflective coating 40 according to the invention. As will be described in further detail below, the reflective coating can comprise a single layer or multiple layers as shown in FIG. 2C. Layers 64, 66, 68, 70, and 72 represent various materials that are applied to the front facet 16. The number of layers, thickness of each layer and the material used for each layer are changed to produce different reflectance vs. wavelength characteristics.

For example, a simple realization of this concept is obtained by applying a three-layer coating (e.g., layers 64, 66, and 68) on the front output facet 16 to provide a flat reflectance. The coating increases the naturally occurring 30% semiconductor-to-air reflectance to a constant 60% reflectance for properly chosen layer thicknesses. This increased front facet reflectance increases the laser tuning range so that the low end wavelength is 1.46 $\mu$m and the high end wavelength is 1.63 $\mu$m in FIG. 4. The front facet natural solid-to-air reflectivity, however, can be increased anywhere within the range of between 40% to 100% depending upon the pre-existing and desired laser characteristics.

Figure 3:
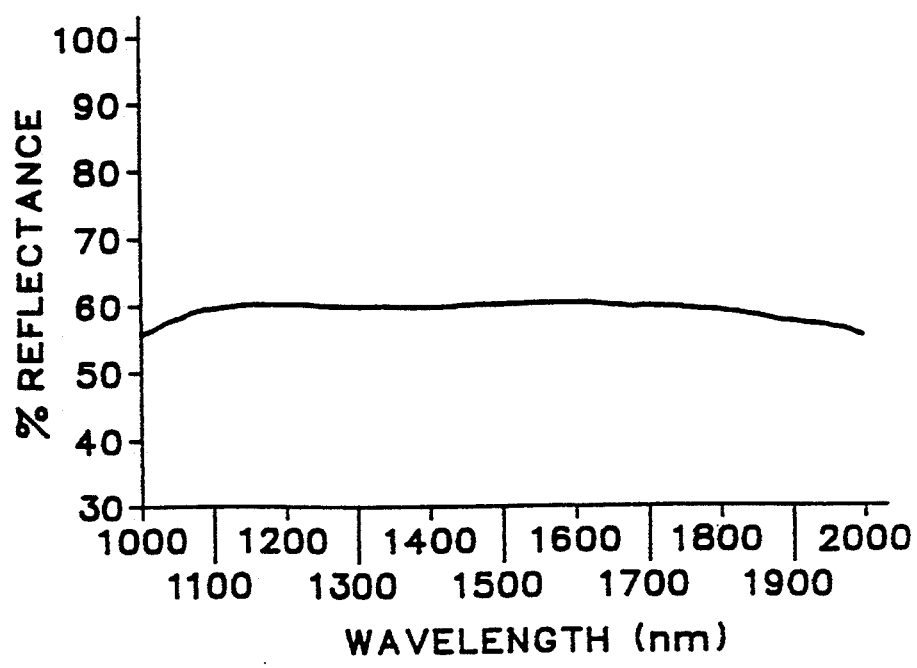
FIG. 3 is a graph showing the actual reflectance vs. wavelength response for a nominally flat reflective coating according to the invention.

FIG. 3 is a graph showing the reflectance curve of an actual "flat" reflective coating. As can be seen from the graph, the reflectance remains substantially constant at approximately 60% across the wavelength range of 1100 nm to 1800 nm. In theory, a single quarter wave (0.25 $\lambda$) thickness layer of higher refractive index material (i.e., layer 64) can be applied to the front facet to increase the reflectance. Quarter wave optical stacks are another method of achieving flat reflectance coatings.

A quarter-wave optical stack comprising two layers of alternating materials can be used, each layer of material having a quarter wave optical thickness (0.25 $\lambda$) to increase the reflectance. Flat reflective coatings can be made from materials such as aluminum oxide ($Al_2O_3$), silicon (Si), and silicon dioxide ($SiO_2$). Aluminum oxide, for example, is known for good adhesion to indium phosphide (InP) and indium gallium arsenide phosphide (InGaAsP) which are materials typically used in semiconductor laser fabrication. Therefore, $Al_2O_3$ can be easily applied as the first layer to the front facet 16 of laser chip 14.

Figure 4:
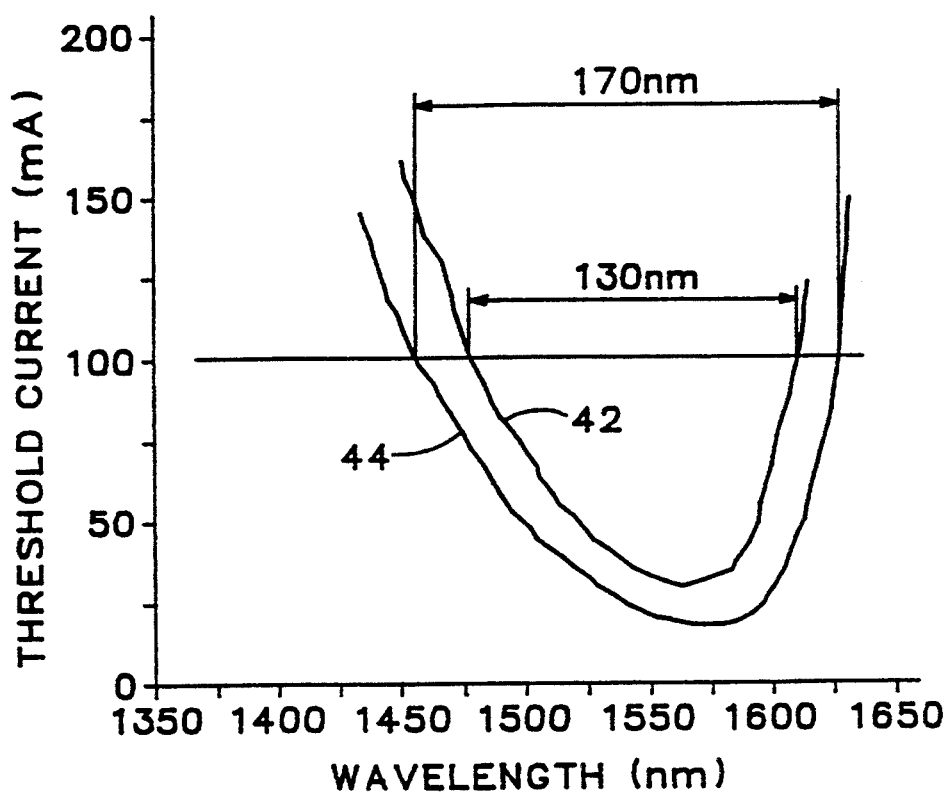
FIG. 4 is a graph showing the threshold current results of applying a flat reflective coating on the front output facet of a first semiconductor chip according to the invention.
Figure 5:
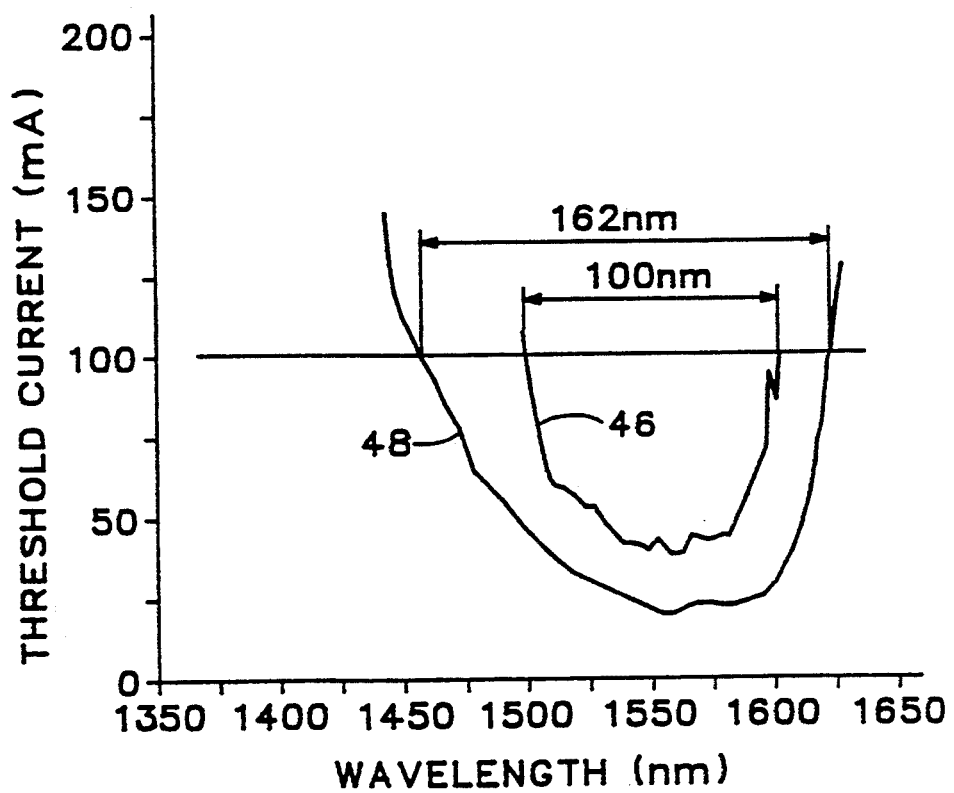
FIG. 5 is a graph showing the results of applying a flat reflective coating on the front output facet of a second semiconductor chip according to the invention.

FIGS. 4 and 5 are graphs showing threshold current vs. wavelength for two different laser chips. The semiconductor laser as described in pending application Ser. No. 07/896,276 is used, however, any type of semiconductor laser would exhibit similar results. Referring to FIG. 4, the benefits of increasing $R_{oc}$ can be seen by comparing the "tuning curves" 42 and 44 which represent uncoated and coated front facets 16, respectively. The tuning curves indicate the threshold current required to cause the chip to reach oscillation as a function of wavelength. As discussed above, a lower threshold current is desirable for increasing chip operating life and for increasing the capacity to drive the laser at a wider range of operating currents and wavelengths. Curve 42 is a tuning curve for a laser with an uncoated front output facet having a reflectivity of $R_{oc}=0.31$. Curve 44 is obtained with the same laser chip after a flat reflective coating of $R_{oc}=0.61$ was applied to the front output facet. The reflective coating has increased the tuning range of the laser from 130 nm to 170 nm at a drive current of 100 mA. Thus, the tuning range of the laser is increased by approximately 30%.

FIG. 5 shows the threshold current vs. wavelength for a second laser chip of lower quality than the laser chip used to generate the curves in FIG. 4, a lower quality laser chip being one that has a substantially narrower tuning range and requires more current to reach oscillation. Curve 46 is the curve for an uncoated output facet with a natural reflectivity of $R_{oc}=0.31$ and curve 48 shows the threshold current for the same laser chip with a reflectivity of $R_{oc}=0.61$. It can be seen that the tuning range is increased from 100 nm to 162 nm for a drive current of 100 mA. Thus, the performance was increased by approximately 60% in a laser chip with an initially low tuning range. Overall, the increased reflectance increases performance for semiconductor lasers with varying output and process characteristics.

Notice that in both FIGS. 4 and 5 the threshold current required to cause the laser to go into oscillation is substantially lower when the reflectivity of the front output facet is increased. For example, in FIG. 5 at 1550 nm, the threshold current for curve 46 is approximately 40 milliAmperes (mA) while the threshold current of curve 48 is below 25 mA. Therefore, increasing the reflectivity of the front output facet has also been demonstrated to reduce the laser threshold current. For different types of lasers (e.g., dye or solid state lasers), the active laser medium may be pumped by light coming in either from another laser or a flashlamp. By increasing the output coupler reflectivity, the threshold of incoming pump light can be reduced. Thus, flashlamps would not have to run as hard and less power would have to be supplied to the pump laser.

It is possible that flat reflectance coatings could decrease the output power at wavelengths at the center of the tuning curve. For example, at the center wavelength, the laser chip may require $R_{oc}<0.30$ to produce the maximum possible output power. Therefore, increasing the reflectivity could degrade the laser's optimal output power. To remedy this situation, an optical stack of a different design, as shown by layers 64, 66, 68, 70, and 72 in FIG. 2C, is applied to the front output facet to increase the reflectivity at the outer wavelengths of the laser bandwidth while maintaining a lower reflectivity near the center wavelength. This stack increases the laser tuning range while simultaneously maintaining a high output power at center wavelengths.

Figure 6:
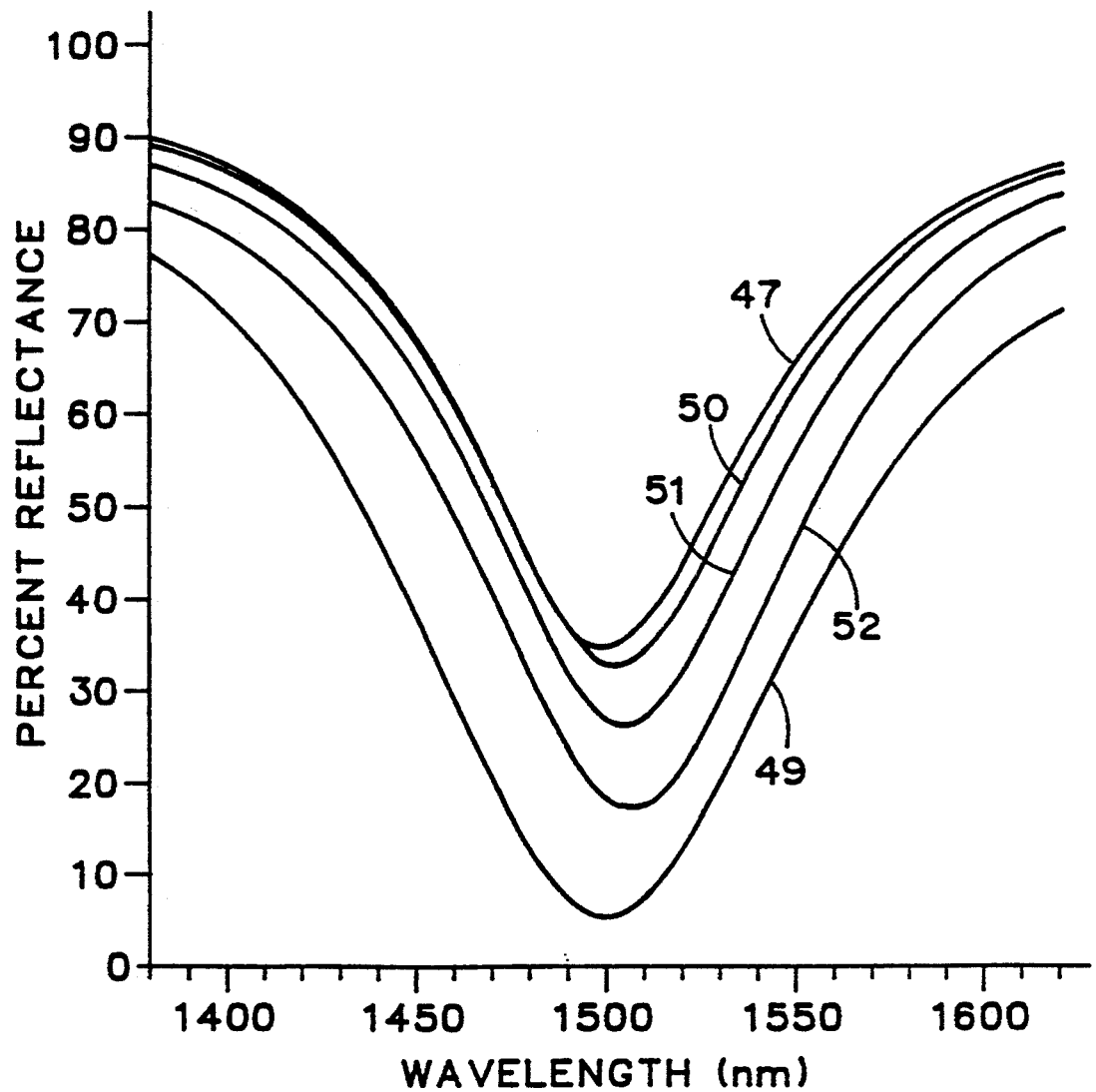
FIG. 6 is a graph showing the reflectance vs. wavelength response for a multi-layer aluminum oxide/silicon reflective coating according to the invention.

Referring to FIG. 6, a complex Fabry-Perot type filter coating, as opposed to a flat reflective coating (see FIG. 3), reflectance varies significantly according to wavelength. The design of Fabry-Perot type filters to yield a particular reflectivity vs. wavelength profile is discussed by S. D. Smith in "Design of Multilayer Filters by Considering Two Effective Interfaces", Journal of the Optical Society of America, Volume 48, no. 1, January 1958, pages 43–50, and is hereby incorporated by reference. S. D. Smith refers to these filters as all-dielectric interference filters. The method for generating the reflectance characteristic that optimizes output power was described earlier.

Curves 47 and 49 show the reflectance/wavelength characteristics for a 4-layer coating and a 5-layer coating, respectively. The 4-layer coating shown in curve 47 starts with a center reflectance between 30–35% and increases the edge reflectance up to 90%. Also, by changing the thickness of layer 5, the reflectance range between curves 47 and 49 can be covered. These complex coatings further increase laser tuning range over that of the flat reflectance coatings, provided that their reflectivities at the edges of the tuning range exceed the flat coating reflectivity.

Multiple layers (see FIG. 2C) are used to tailor the filter characteristics. For example, the five layer curve 49 has a lower reflectance at the center wavelength than the four layer curve 47. The preferred materials for creating the Fabry-Perot type filters on semiconductor lasers as shown in FIG. 6 are various combinations of aluminum oxide ($Al_2O_3$), silicon dioxide ($SiO_2$), and silicon (Si). For example, combinations of $Al_2O_3$/Si, Si/$Al_2O_3$, $SiO_2$/Si, or Si/$SiO_2$ provide the reflectivity effects shown in FIGS. 6 and 7. For a four layer coating, a stack comprising a quarter wave optical thick (0.25 $\lambda$) layer of $Al_2O_3$ (layer 64 in FIG. 2C), a one-wave optical thick (1 $\lambda$) layer of Si (layer 66 in FIG. 2C), a quarter wave optical thick (0.25 $\lambda$) layer of $Al_2O_3$ (layer 68 in FIG. 2C), and a quarter-wave optical thick (0.25 $\lambda$) layer of Si (layer 70 in FIG. 2C) are applied (i.e., 0.25 $\lambda$ $Al_2O_3$/1 $\lambda$ Si/0.25 $\lambda$ $Al_2O_3$/0.25 $\lambda$ Si). The five layer coating generating curve 49 in FIG. 6 comprises 0.25 $\lambda$ $Al_2O_3$/1 $\lambda$ Si/0.25 $\lambda$ $Al_2O_3$/0.25 $\lambda$ Si/0.25 $\lambda$ $Al_2O_3$. Other coating designs are also possible.

The five layer coating with reflectivity profile shown as curve 50 comprises the four layer coating with an additional layer of $Al_2O_3$. The thickness of this fifth layer is variable between 0.01 $\lambda$ and 0.25 $\lambda$. By varying the thickness of the fifth layer, minor variations in the center wavelength reflectance can be generated. For example, curves 50, 51, and 52 show a five layer coating with a fifth layer thickness of 0.05 $\lambda$, 0.10 $\lambda$, and 0.15 $\lambda$, respectively. This provides fine resolution in generating various filter characteristics.

FIG. 9 is a graph comparing the output power vs. wavelength response of an external cavity laser with a bare output facet and with an output facet having a wavelength dependant reflective coating. Curve 88 shows the output response for an external cavity laser having a bare output facet with a natural reflectance of 31%. Curve 86 shows the output response for an external cavity laser having an output facet wavelength-dependent coating similar to those shown in FIG. 6. The output power for the external cavity laser was measured using a drive current of 100 mA.

It can be seen that the output power for the wavelength-dependent reflective coating (curve 86) forms a bell curve with a maximum power output of approximately 14,000 microwatts ($\mu$W) at a center wavelength of 1508 nm. Curve 88, however, has a power output of approximately 7000 $\mu$W at the peak wavelength.

Figure 7:
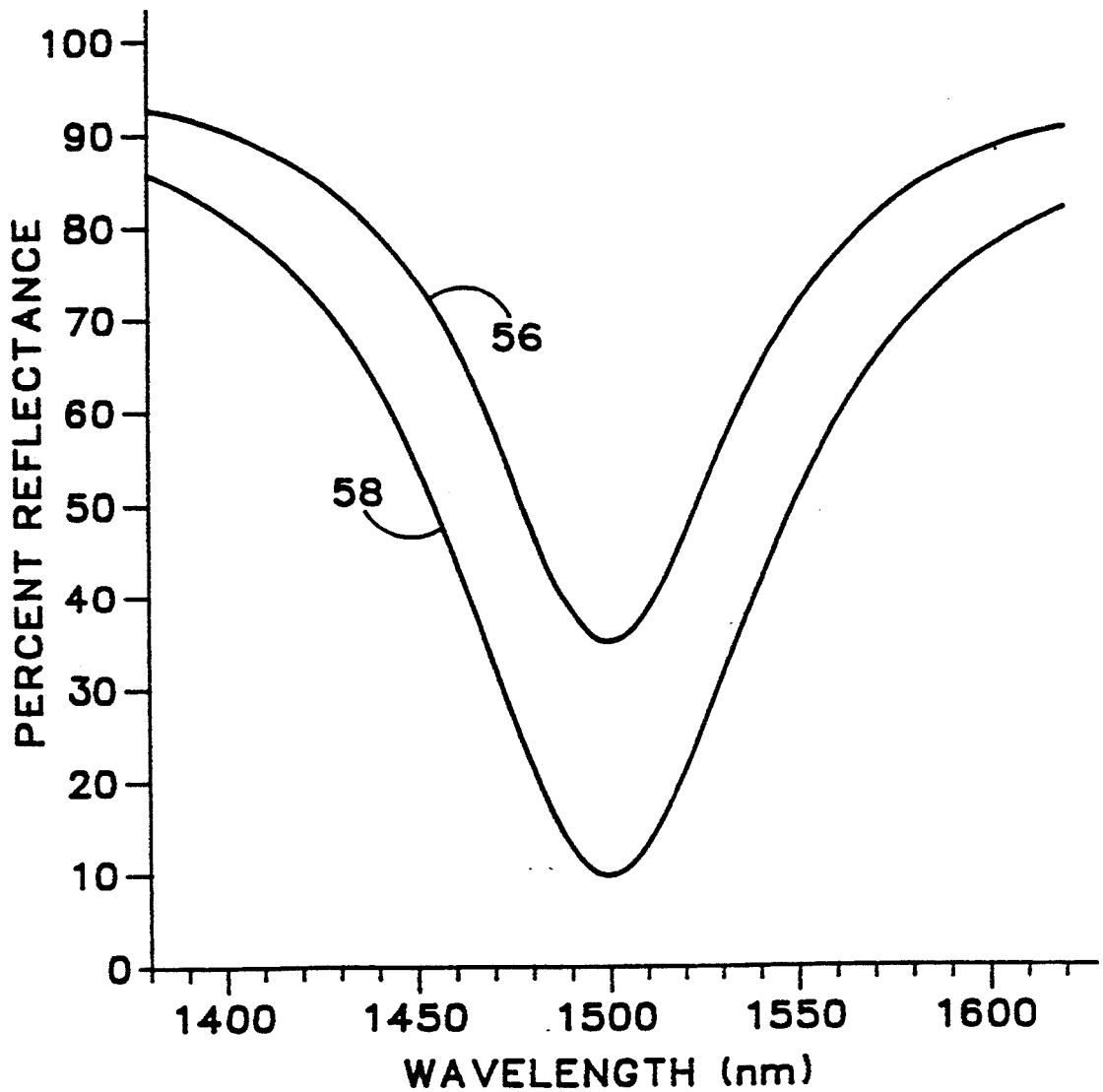
FIG. 7 is a graph showing the reflectance vs. wavelength response for a multi-layer silicon dioxide/silicon reflective coating according to the invention.

To further enhance the wavelength selectivity of the output coupler, $Al_2O_3$ can be replaced with a material with a slightly lower refractive index, such as silicon dioxide ($SiO_2$). FIG. 7 shows the reflectance vs. wavelength curves using silicon dioxide. Curves 56 and 58 show the reflectance characteristics for 4 and 5 layer coatings, respectively. The five layer coating, for example, comprises, 0.25 $\lambda$ $SiO_2$/1 $\lambda$ Si/0.25 $\lambda$ $SiO_2$/0.25 $\lambda$ Si/0.25 $\lambda$ $SiO_2$. It can be seen that silicon dioxide generates a filter with a steeper reflectance characteristic than the aluminum oxide. This steep filter characteristic is generally the difficult parameter to create in a reflective coating.

The reflective coatings shown in FIG. 2C are deposited on the front facet 16 in an evaporator. However, the methods for increasing the output coupler reflectance vary according to the type of tuning laser. For example, in dye lasers or tunable solid state lasers made from titanium doped sapphire, the reflective coatings would be most likely applied to glass. The glass would then be placed in front of the laser as a separate output coupler to obtain the right reflectivity characteristics.

Reflective coatings can be evaporated onto glass as well as directly onto the semiconductor materials following the same general concept. However, the detailed thicknesses and number of layers may differ. Various materials can be used for reflective coatings, but in general layered materials have been found to be the most effective. Alternatively, the output mirror in a ring cavity laser could be coated with multiple layers to optimize reflectivity and subsequently increase tuning range. The multi-layer coatings illustrated above can also be applied to the tunable mirrors (e.g., prism or grating) in the external laser cavity, the output mirror in a ring cavity laser, or any laser mirror to increase the present laser's performance characteristics.

As previously shown in FIGS. 6 and 7, the reflective coating applied to the reflectance filter varies according to wavelength to maximize laser output characteristics. Alternatively, reflectance is altered by adjusting the position of an output coupler with spatially varying reflectance characteristics.

Figure 8A:
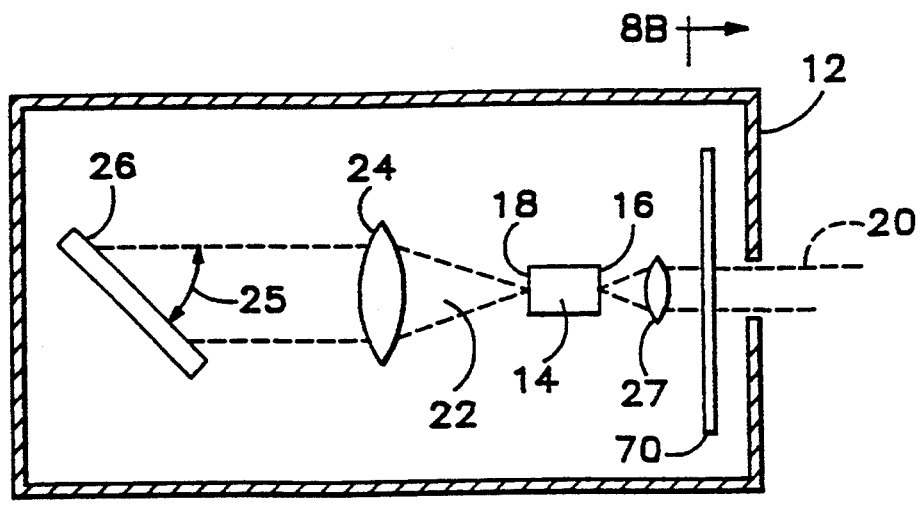
FIG. 8A is a schematic diagram showing the external cavity laser of FIG. 1 with a separate variable reflectance output coupler.
Figure 8B:
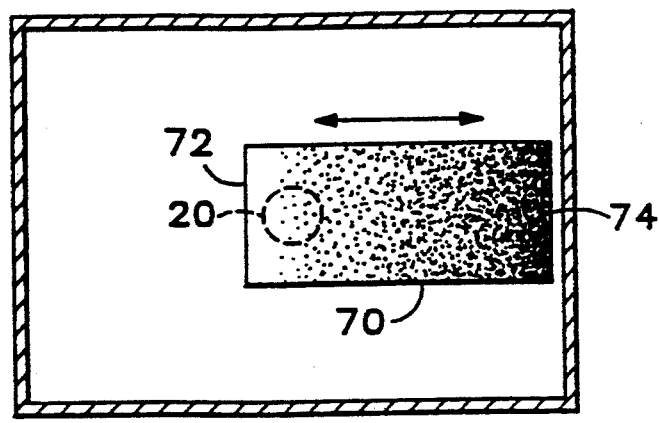
FIG. 8B is a side view of the output coupler shown in FIG. 8A.

For example, FIG. 8A is a schematic of the external cavity laser shown in FIG. 1 with the addition of a separate linear output coupler 70. The front facet 16 would most likely be AR-coated in this case. FIG. 8B is a side view of the output coupler 70 shown in FIG. 8. The output coupler is positioned at normal incidence to the optical beam 20. The output coupler reflectance varies from 0% at the first end 72 to 100% at the second end 74. The variable reflectance filter may be constructed by using a particular reflective coating and deposition method on a substrate or by properly positioning in a line or circle individual small sections each having a specific reflectance.

The external cavity laser shown in FIG. 8A operates in the following manner. A specific laser wavelength is selected by varying the angle 25 of grating 26. The output coupler 70 is then moved laterally in a direction perpendicular to the optical beam 20 until the area on output coupler 70 with the appropriate reflectance is positioned in front of beam 20. The appropriate reflectance is selected by first determining the theoretical reflectance at a given operating current that produces optimum output power as described above (see Eq. 3 for example). The position on the output coupler 70 with the optimal reflectance is then moved in front of the beam 20. In practice, reflectance may be varied to empirically optimize output power.

Figure 8C:
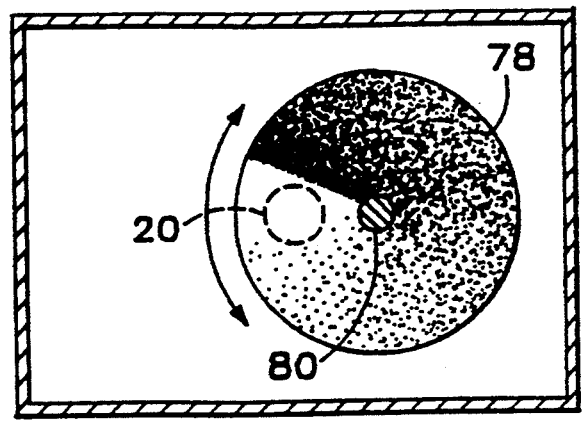
FIG. 8C is a side view of a circular variable reflectance output coupler.

FIG. 8C is an alternative embodiment of the variable reflectance output coupler. A circular output coupler 78 is moved either clockwise or counter clockwise about a center pivot 80. The output coupler 78 is rotated so that the area on output coupler 78 with the optimal reflectance is located in front of the beam 20. Thus, maximum output power is provided for a wide range of wavelengths by changing the effective reflectance provided by couplers 74 and 78.

Having described and illustrated the principles of the invention in a preferred embodiment thereof, it should be apparent that the invention can be modified in arrangement and detail without departing from such principles. We claim all modifications and variation coming within the spirit and scope of the following claims.

What is claimed is:

1. A tunable laser comprising:
   a pumped gain medium having a first and second end for generating a laser light within a given wavelength tuning range having a given threshold pumping level for each wavelength within the given tuning range, the gain medium emitting the laser light out both the first and second end;
   an output coupler for outputting the laser light;
   a coating on the output coupler having a reflectance $R_{oc}$ varied according to wavelength to yield the maximum possible output power from the tunable laser at each wavelength through transmitting the optimal portion of the circulating power thereby increasing at least one of the given tuning range and the output power; and
   tuning means for selecting different wavelengths of the laser light emitted from the gain medium, the tuning means controlling which wavelength of laser light is emitted from the output coupler.

2. The laser according to claim 1 wherein the gain medium comprises a semiconductor laser having a first and second end, the semiconductor laser generating the laser light above a predefined threshold current.

3. The laser according to claim 1 wherein the coating reduces the given threshold pumping level for various laser light wavelengths.

4. The laser according to claim 2 wherein the output coupler comprises the first end of the semiconductor laser and the coating is deposited on said first end.

5. The laser according to claim 1 wherein the gain medium, output coupler, and tuning means comprise an external cavity laser, the output coupler emitting laser light out a first end of said laser.

6. The laser according to claim 1 wherein the coating comprises multiple layers of material each having an associated optical thickness, wherein the material in each layer is variable from the material in any of the other layers.

7. The laser according to claim 1 wherein the coating includes any combination of at least one of the substances aluminum oxide ($Al_2O_3$), silicon dioxide ($SiO_2$), and silicon (Si) in any number of layers applied to the output coupler.

8. The laser according to claim 7 wherein the coating comprises alternating layers of aluminum oxide ($Al_2O_3$) and silicon (Si), the first layer of aluminum oxide having an approximate 0.25 wavelength optical thickness, the first layer of silicon having an approximate 1.0 wavelength optical thickness, and each subsequent layer having an approximate 0.25 wavelength optical thickness, at a given wavelength.

9. The laser according to claim 7 wherein the coating comprises alternating layers of silicon dioxide and silicon, the first layer of silicon dioxide having an approximate 0.25 wavelength optical thickness, the first layer of silicon having an approximate 1.0 wavelength optical thickness, and each subsequent layer having an approximate 0.25 wavelength optical thickness, at a given wavelength.

10. The laser according to claim 1 wherein the output coupler is movable into different positions in relation to the gain medium.

11. The laser according to claim 10 wherein the output coupler has a spatially varying reflectivity, the position of the output coupler in relation to the gain medium determining the amount of laser light reflectance.

12. A laser according to claim 10 wherein the reflectivity of the reflective coating varies uniformly along the output coupler.

13. A laser according to claim 12 wherein the output coupler comprises a circular disk that rotates in a plane approximately perpendicular to the direction that the laser light is output from the laser.

14. A laser according to claim 12 wherein the output coupler comprises a rectangle that moves in a plane approximately perpendicular to the direction that the laser light is output from the laser.

15. A laser according to claim 1 wherein the coating has a generally inverted bell shaped reflectance curve in relation to laser light wavelength, the coating having a low reflectance at a center wavelength and increasing in reflectance at wavelengths less than and greater than the center wavelength.

16. A tunable laser according to claim 1 wherein the reflectivity $R_{oc}$ is related to the output power $P_{out}$ as follows:

$$(P_{out}/P_{sat}) = (1 - R_{oc}) \frac{\sqrt{R_{back}}}{(\sqrt{R_{oc}} + \sqrt{R_{back}})(1 - \sqrt{R_{oc}R_{back}})} ((\Gamma g - \alpha)L_{chip} + \ln \sqrt{R_{oc}R_{back}})$$

wherein $P_{sat}$ is a circulating saturation power, $\Gamma$ is an optical confinement factor, "g" is a gain medium gain coefficient per unit length including confinement effects, $L_{chip}$ is a gain medium length and $R_{back}$ is a power reflectivity from the tuning means including any coupling loss;

the reflectivity $R_{oc}$ selected to have a value that maximizes $P_{out}/P_{sat}$ at each wavelength.

17. A laser according to claim 1 wherein a medium to high reflectivity $R_{oc}$ is related to the output power as follows:

$$(P_{out}/P_{sat}) = (1 - R_{oc}) \left( \frac{2\Gamma g_0 L_{chip}}{\ln(1/(R_{oc}R_{back})) + 2\alpha L_{chip}} - 1 \right),$$

wherein $P_{sat}$ is a circulating saturation power, $P_{out}$ is the output power, $\Gamma$ is an optical confinement factor, $g_0$ is an unsaturated gain medium gain coefficient per unit length, $\alpha$ is a gain medium loss coefficient per unit length including confinement effects, $L_{chip}$ is a gain medium length and $R_{back}$ is a power reflectivity from the tuning means including any coupling loss, and the reflectivity $R_{oc}$ selected to have a value that maximizes Pout/Psat at each wavelength.

18. A tunable laser comprising:
a pumped gain medium having a first and second end for generating a laser light within a given wavelength tuning range, at a given output power and having given gain medium gain and loss coefficients and a given threshold pumping level for each wavelength, the gain medium emitting the laser light out both the first and second end;
an output coupler for outputting the laser light;
tuning means for selecting different wavelengths of the laser light emitted from the gain medium, the tuning means controlling which wavelength of laser light is emitted from the output coupler; and
a coating on the output coupler having a spectrally flat reflectance that reflects approximately the same percentage of light independently of the light wavelength and having a reflectance $R_{oc}$ at each wavelength related to a given expression as follows:

$$R_{oc}R_{back} \mathrm{Exp}\,[2(\Gamma g - \alpha)L_{chip}],$$

wherein $\Gamma$ is an optical confinement factor, "g" is a gain medium gain coefficient per unit length, $\alpha$ is a gain medium loss coefficient per unit length including confinement effects, $L_{chip}$ is a gain medium length and $R_{back}$ is a power reflectivity from the tuning means including any coupling loss, the coating reflectance $R_{oc}$ varied according to wavelength so that $R_{oc}$ is large enough to cause the given expression to be greater than or equal to one at each selected wavelength thereby providing at least one of said decreased threshold pumping level and increased tuning range.

19. A method for varying the output characteristics of a tunable external cavity laser comprising:
providing a pumped laser gain medium for generating a laser light within a given wavelength tuning range having a given threshold pumping level for each wavelength within the given tuning range;
providing an output coupler having a reflectance $R_{oc}$ at each wavelength for outputting the laser light;
selecting the reflectance $R_{oc}$ according to wavelength to yield the maximum possible output power from the tunable laser at each wavelength through transmitting the optimal portion of the circulating power thereby increasing at least one of said given tuning range and said output power; and
selecting different wavelengths of the laser light emitted from the gain medium thereby controlling which wavelength of laser light is emitted from the output coupler.

20. The method according to claim 19 wherein the laser has a given gain curve and including matching the reflectivity of the output coupler with the laser gain curve so that the output coupler reflectivity is lowest for wavelengths near a maximum value of the gain curve and the output coupler reflectivity is greater for wavelengths spaced away from the maximum value of the gain curve.

21. The method according to claim 19 wherein increasing the output facet reflectivity reduces an associated threshold current required for each laser wavelength to oscillate within the gain medium.

22. A method according to claim 19 including coating the output coupler with materials having given compositions and dimensions so as to vary the reflectivity of the coating according to the wavelength of emitted laser light while the coating materials maintain the same given compositions and dimensions.

23. A method according to claim 19 including the following steps:
continuously varying a concentration of the reflective material across the output coupler, the reflectance being proportional to the concentration of reflective material; and
moving the position of the output coupler in front of the laser gain medium according to the concentration of reflective material thereby varying the reflectance of the laser light in the output coupler.

24. A method according to claim 19 wherein the reflectivity $R_{oc}$ has a given relationship with respect to the output power as follows:

$$(P_{out}/P_{sat}) = (1 - R_{oc}) \frac{\sqrt{R_{back}}}{(\sqrt{R_{oc}} + \sqrt{R_{back}})(1 - \sqrt{R_{oc}R_{back}})} ((\Gamma g - \alpha)L_{chip} + \ln \sqrt{R_{oc}R_{back}});$$

wherein $P_{sat}$ is a circulating saturation power, $P_{out}$ is the output power, $\Gamma$ is an optical confinement factor, "g" is a gain medium coefficient per unit length, $\alpha$ is a gain medium loss coefficient per unit length including confinement effects, $L_{chip}$ is a gain medium length and $R_{back}$ is a power reflectivity from the tuning means including any coupling loss, and
including the step of varying the output coupler reflectivity to maximize $P_{out}/P_{sat}$ at each wavelength.

25. A method according to claim 19 wherein a medium to high reflectivity $R_{oc}$ is related to the output power as follows:

$$(P_{out}/P_{sat}) = (1 - R_{oc})\left(\frac{2\Gamma g_0 L_{chip}}{\ln(1/(R_{oc}R_{back})) + 2\alpha L_{chip}} - 1\right),$$

wherein Psat is a circulating saturation power, Pout is the output power, $\Gamma$ is an optical confinement factor, $g_0$ is an unsaturated gain medium gain coefficient per unit length, $\alpha$ is a gain medium loss coefficient per unit length including confinement effects, $L_{chip}$ is a gain medium length and $R_{back}$ is a power reflectivity from the tuning means including any coupling loss, and
including the step of varying the output coupler reflectivity $R_{oc}$ to maximize Pout/Psat at each wavelength.

26. A method for optimizing output characteristics of an external cavity laser comprising:
providing a pumped gain medium, a wavelength selecting element and a predetermined net gain, yielding a tuning range, the gain medium having a laser pumping threshold varying according to the wavelength of light output from the laser and including an output coupler reflectance $R_{oc}$ at each wavelength having a given relationship to the output power as follows:

$$(P_{out}/P_{sat}) = (1 - R_{oc}) \frac{\sqrt{R_{back}}}{(\sqrt{R_{oc}} + \sqrt{R_{back}})(1 - \sqrt{R_{oc}R_{back}})} ((\Gamma g - \alpha)L_{chip} + \ln \sqrt{R_{oc}R_{back}})$$

wherein $P_{sat}$ is a circulating saturation power, $P_{out}$ is the output power, $\Gamma$ is an optical confinement factor, "g" is a gain medium gain coefficient per unit length, $\alpha$ is a gain medium loss coefficient per unit length including confinement effects, $L_{chip}$ is a gain medium length and $R_{back}$ is a power reflectivity from the tuning means including any coupling loss,
calculating a net gain for a given laser pumping level for each wavelength within said tuning range using a set of data derived at the given pumping threshold;
determining an output coupler reflectance value according to wavelength that maximizes $P_{out}/P_{sat}$ at each wavelength within said tuning range using the calculated laser net gain for said given pumping level; and
applying a coating on the output coupler that has a reflectance vs. wavelength relationship that is similar to said determined output coupler reflectivity values.

27. A method according to claim 26 wherein for a medium to high reflectivity $R_{oc}$ is related to the output power as follows:

$$(P_{out}/P_{sat}) = (1 - R_{oc})\left(\frac{2\Gamma g_0 L_{chip}}{\ln(1/(R_{oc}R_{back})) + 2\alpha L_{chip}} - 1\right)$$

wherein $P_{sat}$ is a circulating saturation power, $P_{out}$ is the output power, $\Gamma$ is an optical confinement factor, $g_0$ is an unsaturated gain medium gain coefficient per unit length, $\alpha$ is a gain medium loss coefficient per unit length including confinement effects, $L_{chip}$ is a gain medium length and $R_{back}$ is a power reflectivity from the tuning means including any coupling loss, and
including the step of varying the output coupler reflectivity $R_{oc}$ to maximize Pout/Psat at each wavelength.

* * * * *